(12) United States Patent
Kim et al.

(10) Patent No.: US 11,139,806 B2
(45) Date of Patent: Oct. 5, 2021

(54) SYSTEM ON CHIP PERFORMING CLOCK TRAINING AND COMPUTING SYSTEM INCLUDING THE SAME

(71) Applicant: SAMSUNG ELECTRONICS CO., LTD., Suwon-si (KR)

(72) Inventors: Tae-hyung Kim, Yongin-si (KR); Sung-jae Moon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 236 days.

(21) Appl. No.: 16/112,921

(22) Filed: Aug. 27, 2018

(65) Prior Publication Data

US 2019/0253043 A1 Aug. 15, 2019

(30) Foreign Application Priority Data

Feb. 9, 2018 (KR) .......................... 10-2018-0016560

(51) Int. Cl.
*G06F 1/00* (2006.01)
*H03K 5/156* (2006.01)
*G06F 1/10* (2006.01)

(52) U.S. Cl.
CPC ............. *H03K 5/1565* (2013.01); *G06F 1/10* (2013.01)

(58) Field of Classification Search
CPC .................................................... H03K 5/1565
See application file for complete search history.

(56) References Cited

U.S. PATENT DOCUMENTS

| | | | |
|---|---|---|---|
| 7,647,467 B1 | 1/2010 | Hutsell et al. | |
| 8,644,085 B2 | 2/2014 | Kim et al. | |
| 9,448,281 B2 | 9/2016 | Chien et al. | |
| 9,473,290 B2* | 10/2016 | Rowland | ................... G06F 1/08 |
| 2002/0122514 A1 | 9/2002 | Hofmann et al. | |
| 2007/0008791 A1 | 1/2007 | Butt et al. | |
| 2010/0039157 A1* | 2/2010 | Kaeriyama | ........... H03L 7/0995 327/292 |
| 2012/0019299 A1* | 1/2012 | McLeod | ............. H03K 5/1565 327/175 |
| 2013/0063191 A1 | 3/2013 | Patil et al. | |
| 2013/0106479 A1* | 5/2013 | Kim | ..................... H03K 5/1565 327/175 |
| 2014/0009197 A1 | 1/2014 | Yasuda | |
| 2014/0140141 A1* | 5/2014 | Grant | ............... G11C 29/50016 365/185.25 |
| 2014/0333361 A1 | 11/2014 | Chau et al. | |
| 2017/0278554 A1 | 9/2017 | Srinivas et al. | |

* cited by examiner

*Primary Examiner* — Mohammed H Rehman

(74) *Attorney, Agent, or Firm* — Sughrue Mion, PLLC

(57) ABSTRACT

A system on chip includes a clock generator configured to generate a clock signal, and output the clock signal to a component device external to the system on chip. The system on chip further includes a duty ratio determiner configured to determine a component duty ratio, in response to a response that is received from the component device according to the clock signal, and a duty ratio adjustor configured to adjust a current duty ratio of the clock signal to the component duty ratio, and output the clock signal of which the current duty ratio is adjusted, to the component device.

15 Claims, 11 Drawing Sheets

| Duty Ratio | Clock |
|---|---|
| DR1 | Clk1 |
| DR2 | Clk2 |
| DR3 | Clk3 |
| DR4 | Clk4 |

→ Mg_Rd1
→ Mg_Rd2
→ Mg_Rd3
→ Mg_Rd4

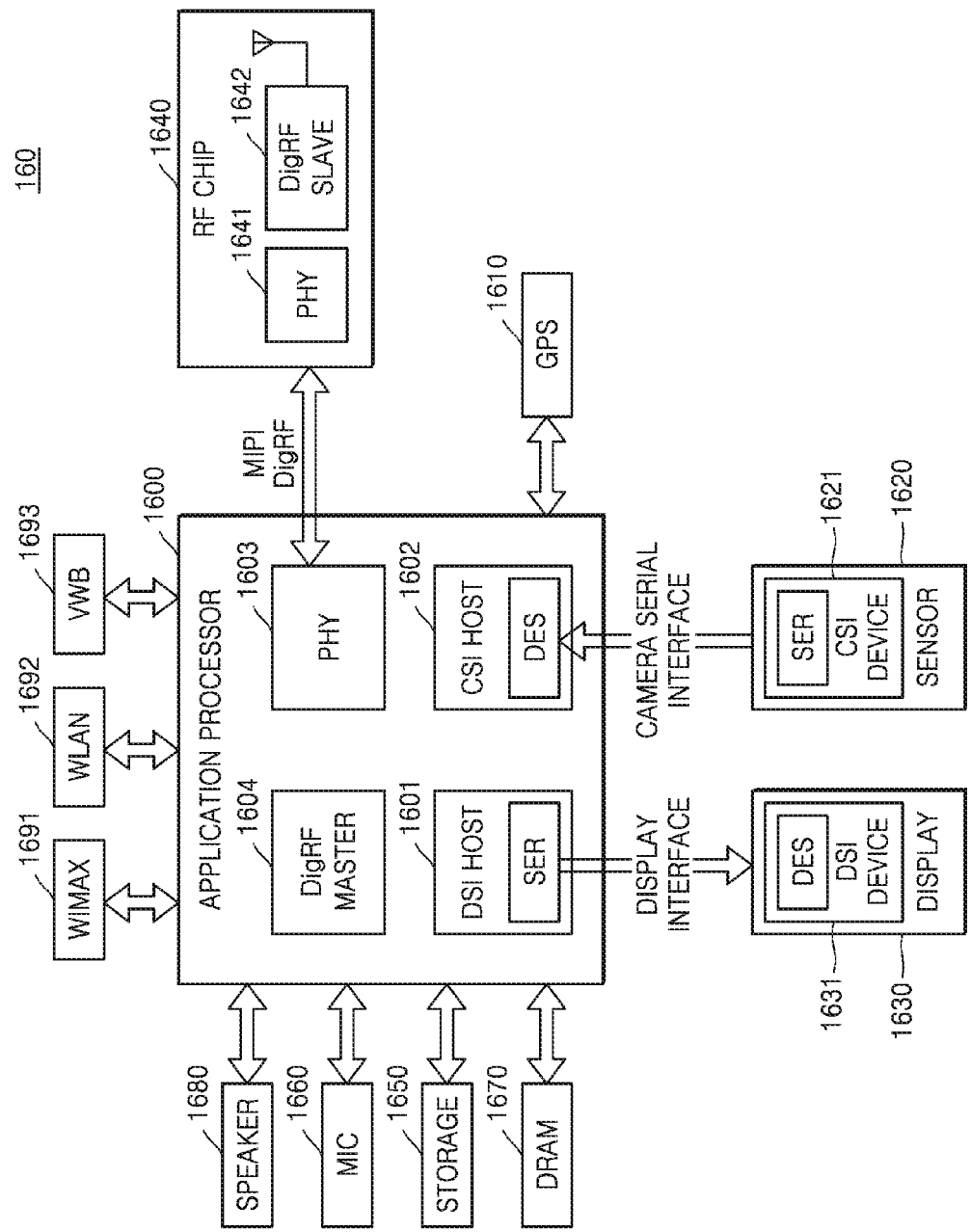

SYSTEM ON CHIP PERFORMING CLOCK TRAINING AND COMPUTING SYSTEM INCLUDING THE SAME

CROSS-REFERENCE TO RELATED APPLICATION

This application claims priority from Korean Patent Application No. 10-2018-0016560, filed on Feb. 9, 2018, in the Korean Intellectual Property Office, the disclosure of which is incorporated herein by reference in its entirety.

BACKGROUND

1. Field

Apparatuses and methods consistent with example embodiments relate to a system on chip and a computing system including the same, and more particularly, to a system on chip performing clock training with a component device and a computing system including the same.

2. Description of Related Art

As mobile products such as a tablet personal computer (PC) or a cellular phone develop, a computing system including a component device such as a memory device and a system on chip (SOC) should have high performance. The SOC and the component device exchange data signals and data strobe signals by using a clock. A duty ratio of the clock may change due to temperature and voltage, and when an inaccurate duty ratio is used, a read margin may be degraded. Accordingly, the need for a clock for use in communication between the SOC and the component device to have an optimum duty ratio despite temperature and voltage characteristics, has risen for an accurate operation of the computing system.

SUMMARY

According to example embodiments, a system on chip includes a clock generator configured to generate a clock signal, and output the clock signal to a component device external to the system on chip. The system on chip further includes a duty ratio determiner configured to determine a component duty ratio, in response to a response that is received from the component device according to the clock signal, and a duty ratio adjustor configured to adjust a current duty ratio of the clock signal to the component duty ratio, and output the clock signal of which the current duty ratio is adjusted, to the component device.

According to example embodiments, a computing system includes a system on chip configured to generate a clock signal, and transmit a command and the clock signal, using the clock signal. The computer system further includes a component device configured to process the command that is received from the system on chip, based on the clock signal that is received from the system on chip. The system on chip includes a clock generator configured to generate the clock signal, a duty ratio determiner configured to determine a component duty ratio, in response to a response that is received from the component device according to the clock signal, a duty ratio adjustor configured to adjust a current duty ratio of the clock signal, to the component duty ratio, and output the clock signal of which the current duty ratio is adjusted, to the component device.

According to example embodiments, a clock training method of a system on chip for transmitting and receiving a plurality of signals to and from a component device, includes generating a clock signal of a first duty ratio, outputting a command to the component device, using the clock signal, and adjusting the first duty ratio of the clock signal to a second duty ratio different from the first duty ratio, based on a response corresponding to the command, the response being received from the component device.

BRIEF DESCRIPTION OF THE DRAWINGS

FIG. 13 is a block diagram illustrating an interface for use in a computing system, according to an example embodiment.

DETAILED DESCRIPTION OF EXAMPLE EMBODIMENTS

Figure 1:
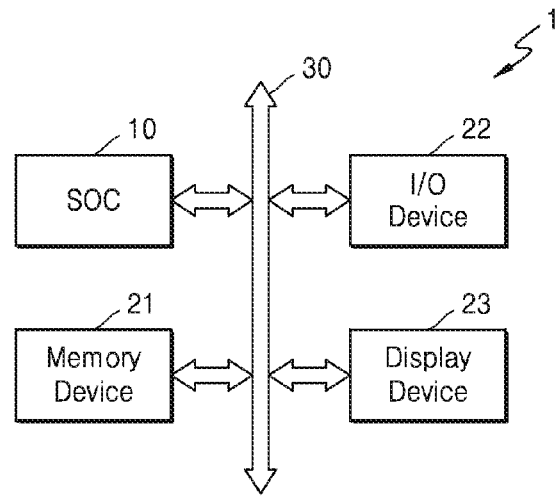
FIG. 1 is a block diagram illustrating a computing system according to an example embodiment.

FIG. 1 is a block diagram illustrating a computing system 1 according to an example embodiment.

Referring to FIG. 1, the computing system 1 may include a system on chip (SOC) 10, a memory device 21, an input/output (I/O) device 22, and a display device 23, and the above elements may be electrically connected to a bus 30. The computing system 1 may be implemented, for example, as a mobile device, a desktop computer, a server, or the like.

Component devices such as the memory device 21, the I/O device 22, and the display device 23, and the SOC 10 may perform communication by using a clock via the bus 30. The memory device 21 may include a volatile memory device (e.g., static random access memory (SRAM), dynamic random access memory (DRAM), a latch, a flip-flop, a register) that loses stored data when power supply is cut off, and a non-volatile memory device (e.g., NAND flash memory (NAND), vertical NAND, NOR flash memory, resistive random access memory, phase-change memory, magnetoresistive random access memory) that does not lose stored data even when power supply is cut off. In an embodiment, the memory device 21 may be a DRAM device.

The I/O device 22 may be a connecting device for communicating with the outside of the computing system 1. That is, the I/O device 22 may receive signals from the outside or may transmit signals to the outside. The display device 23 may receive image data from the SOC 10 and may output the received image data to a user.

The SOC 10 may include a plurality of elements in one chip. For example, the SOC 10 may include a device controller for controlling component devices such as the memory device 21, the I/O device 22, and the display device 23. In some embodiments, the SOC 10 may be implemented as an application processor (AP).

According to the inventive concept, the SOC 10 may perform clock training during an initialization operation with a component device. In the present specification, clock training or a clock training method may refer to a method of finding an optimum duty ratio of a clock for communication between the SOC 10 and a component device. The SOC 10 may determine an optimum duty ratio through clock training and may perform communication by transmitting or receiving data and signals such as a command to or from a component device through the determined duty ratio.

Although FIG. 1 shows the memory device 21, the I/O device 22, and the display device 23 as component devices, this is an example, and one of the memory device 21, the I/O device 22, and the display device 23 may be omitted or an additional element may be included as a component device in the computing system 1 in addition to the memory device 21, the I/O device 22, and the display device 23.

Figure 2:
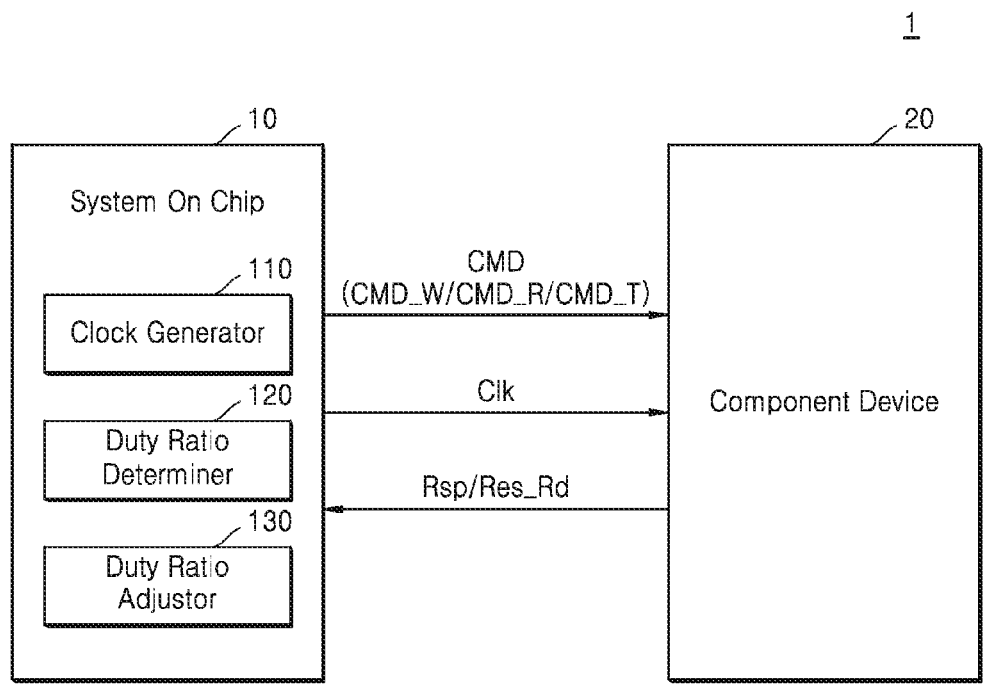
FIG. 2 is a block diagram illustrating a computing system according to an example embodiment.

FIG. 2 is a block diagram illustrating the computing system 1 according to an example embodiment.

Referring to FIG. 2, the computing system 1 may include the SOC 10 and a component device 20, and the SOC 10 may include a clock generator 110, a duty ratio determiner 120, and a duty ratio adjustor 130.

The SOC 10 may output a command CMD to the component device 20, and the component device 20 may output a response Rsp or a read result Res_Rd to the SOC 10 in response to the command CMD. In an embodiment, the command CMD may include a write command CMD_W for writing data to a memory of the component device 20 or a read command CMD_R for reading data from a memory of the component device 20. In an embodiment, the command CMD may include a training command CMD_T for training the component device 20.

The SOC 10 may generate a clock Clk (a clock signal) and output the clock Clk to the component device 20, and the component device 20 may output the response Rsp or the read result Res_Rd to the SOC 10 in synchronization with the clock Clk. That is, the component device 20 may adjust an output timing of the response Rsp or the read result Res_Rd, based on the clock Clk.

The clock generator 110 may generate a row clock repeating logic high and logic low according to a determined cycle. In the present specification, a row clock may refer to a clock having a duty ratio (a current duty ratio) not adjusted by the duty ratio adjustor 130. The duty ratio determiner 120 may determine a component duty ratio of a clock, based on the response Rsp. In the present specification, a component duty ratio may refer to a duty ratio determined for the SOC 10 to communicate with the component device 20. The duty ratio determiner 120 may output the component duty ratio to the duty ratio adjustor 130. The duty ratio adjustor 130 may output the clock Clk generated by adjusting the row clock to the component duty ratio to the component device 20.

According to the inventive concept, the duty ratio determiner 120 may receive the response Rsp from the component device 20, and may adaptively determine a component duty ratio, based on the response Rsp, thereby generating the clock Clk having an optimum duty ratio. Accordingly, margin degradation between the SOC 10 and the component device 20 may be prevented, and the performance of the computing system 1 may be improved.

Figure 3:
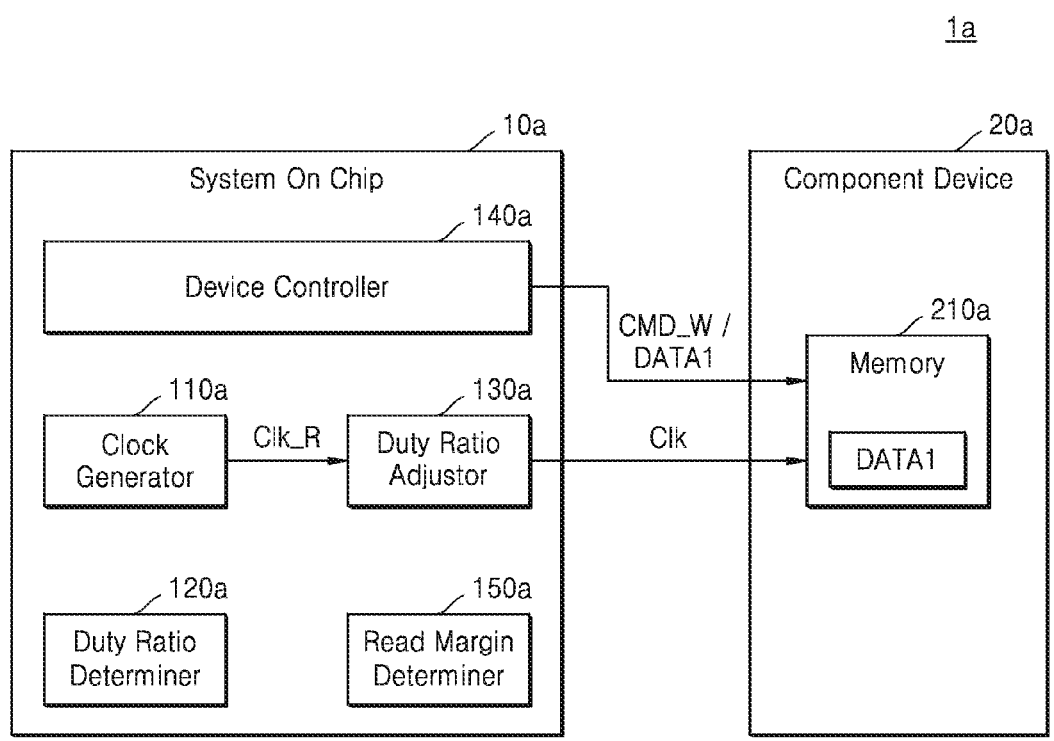
FIG. 3 is a block diagram illustrating a computing system according to an example embodiment.

FIG. 3 is a block diagram illustrating a computing system 1a according to an example embodiment. In more detail, FIG. 3 is a block diagram illustrating the computing system 1a performing an operation of writing predetermined first data, according to a first embodiment. A repeated description of FIG. 2 will be omitted below.

Referring to FIG. 3, the computing system 1a may include an SOC 10a and a component device 20a, and the SOC 10a may include a clock generator 110a, a duty ratio determiner 120a, a duty ratio adjustor 130a, a device controller 140a, and a read margin determiner 150a. The clock generator 110a, the duty ratio determiner 120a, and the duty ratio adjustor 130a may be substantially the same as or similar to the clock generator 110, the duty ratio determiner 120, and the duty ratio adjustor 130 described above with reference to FIG. 1, and thus, a description thereof will be omitted. In addition, the read margin determiner 150a will be described below with reference to FIG. 4. The component device 20a may include a memory 210a.

The device controller 140a may output various commands for controlling the component device 20a. The device controller 140a may output the write command CMD_W for writing first data DATA1 to the memory 210a as well as the first data DATA1 to the component device 20a. In an embodiment, the first data DATA1 may be predetermined data, and the SOC 10a may have determined a data pattern of the first data DATA1.

The clock generator 110a may output a row clock Clk_R having a duty ratio not determined to the duty ratio adjustor 130a, and the duty ratio adjustor 130a may output the clock Clk generated by adjusting a duty ratio of the received row clock Clk_R to the memory 210a. The first data DATA1 may be written to the memory 210a in synchronization with the clock Clk.

The memory 210a may be a volatile memory device (e.g., SRAM, DRAM, a latch, a flip-flop, a register), or a non-volatile memory device (e.g., NAND, vertical NAND, NOR flash memory, resistive random access memory, phase-change memory, magnetoresistive random access memory), and in an embodiment, the memory 210a may be a register. The memory 210a may store the first data DATA1 written by the device controller 140a.

Figure 4:
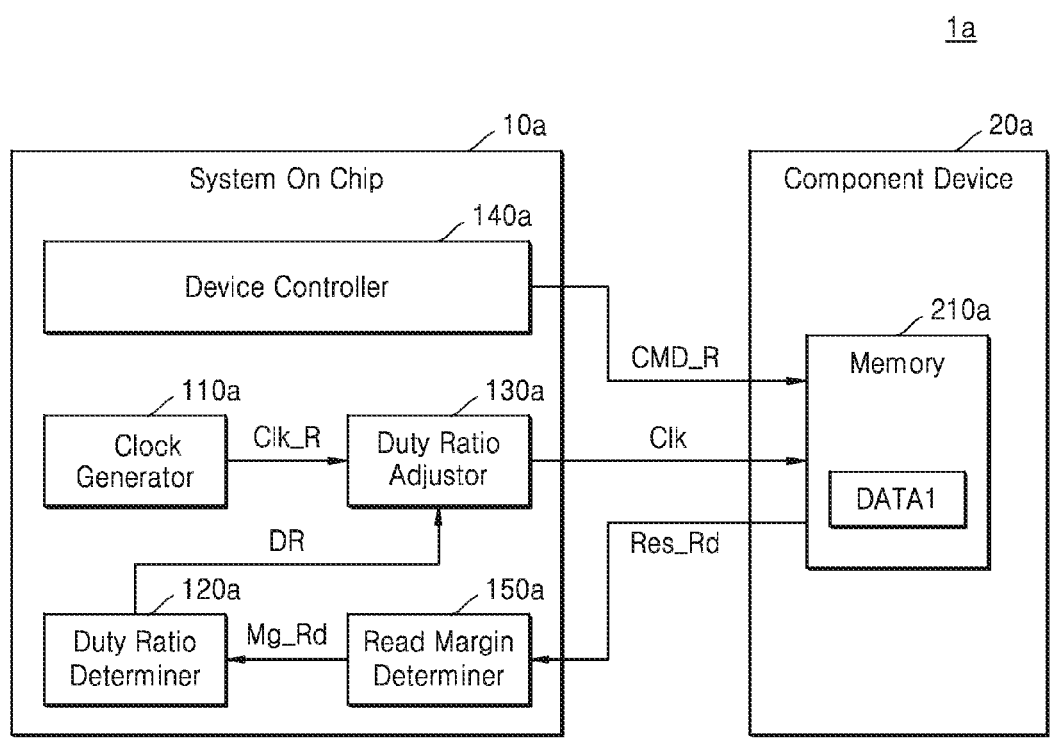
FIG. 4 is a block diagram illustrating a computing system according to an example embodiment.

FIG. 4 is a block diagram illustrating the computing system 1a according to an example embodiment. In more detail, FIG. 4 is a block diagram illustrating the computing system 1a reading, based on a clock, the first data written according to the first embodiment and determining, based on a read result, a component duty ratio DR of the clock Clk. A repeated description of FIGS. 2 and 3 will be omitted below.

Referring to FIG. 4, the computing system 1a may include the SOC 10a and the component device 20a, and the SOC 10a may include the clock generator 110a, the duty ratio determiner 120a, the duty ratio adjustor 130a, the device controller 140a, and the read margin determiner 150a. In addition, the component device 20a may include the memory 210a.

The device controller 140*a* may output the read command CMD_R for reading the first data DATA1 to the memory 210*a* in synchronization with the clock Clk. The component device 20*a* may output a result of reading the first data DATA1 from the memory 210*a* as the read result Res_Rd to the read margin determiner 150*a* in synchronization with the clock Clk.

The read margin determiner 150*a* may determine a read margin Mg_Rd, based on a data pattern of the predetermined first data DATA1 and the read result Res_Rd. In an embodiment, the read margin determiner 150*a* may find a pass zone by comparing the data pattern of the first data DATA1 to the read result Res_Rd, and based on an area of the pass zone, may determine the read margin Mg_Rd. This will be described below with reference to FIGS. 6A and 6B.

The duty ratio determiner 120*a* may determine the component duty ratio DR, based on the read margin Mg_Rd received from the read margin determiner 150*a*. The duty ratio determiner 120*a* may output the determined component duty ratio DR to the duty ratio adjustor 130*a*, and the duty ratio adjustor 130*a* may adjust the row clock Clk_R to the clock Clk having the component duty ratio DR.

According to the inventive concept, smooth communication between the SOC 10*a* and the component device 20*a* may be performed by determining the read margin Mg_Rd, based on the read result Res_Rd, determining an optimum duty ratio as the component duty ratio DR, based on the determined read margin Mg_Rd, and performing clock training in which the clock Clk is adjusted to the component duty ratio DR.

In an embodiment, the above clock training may be performed during an initialization operation between the SOC 10*a* and the component device 20*a*.

Figure 5:
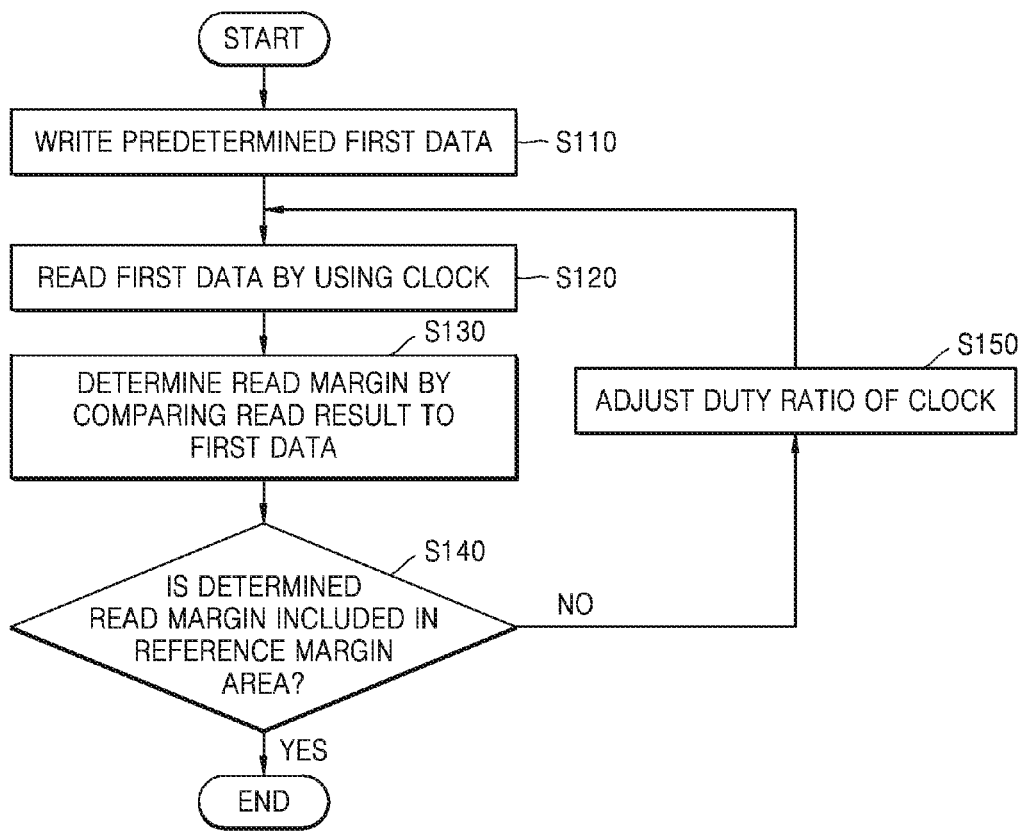
FIG. 5 is a flowchart illustrating a clock training operation method of a system on chip, according to an example embodiment.

FIG. 5 is a flowchart illustrating a clock training operation method of an SOC, according to an example embodiment. In more detail, FIG. 5 is a flowchart illustrating an operation of determining a component duty ratio through duty ratio adjustment of a clock.

Referring to FIGS. 4 and 5, the SOC 10*a* may write the predetermined first data DATA1 to the component device 20*a* (operation S110). The SOC 10*a* may read the first data DATA1 by using the clock Clk (operation S120). The SOC 10*a* may determine the read margin Mg_Rd by comparing the read result Res_Rd to the first data DATA1 (operation S130).

When the determined read margin Mg_Rd is included in a reference margin area (operation S140, YES), the SOC 10*a* may determine a current duty ratio as the component duty ratio DR. When the determined read margin Mg_Rd is not included in the reference margin area (operation S140, NO), a duty ratio of the clock Clk may be adjusted to a duty ratio different from the current duty ratio (operation S150). In an embodiment, the SOC 10*a* may adjust a duty ratio of the clock Clk by raising or lowering the current duty ratio. The SOC 10*a* may repeat operations S120 to S140 by using the adjusted duty ratio.

According to the inventive concept, as described above, an optimum duty ratio whereby the read margin Mg_Rd is included in the reference margin area may be determined by repeating operations S120 to S150, and the SOC 10*a* may smoothly communicate with the component device 20*a* by determining the determined duty ratio as the component duty ratio DR.

Figure 6A:
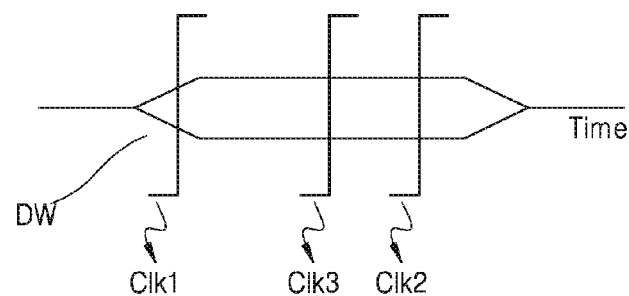
FIGS. 6A and 6B are diagrams illustrating a method of determining a component duty ratio through clock training of a system on chip, according to an example embodiment.
Figure 6B:
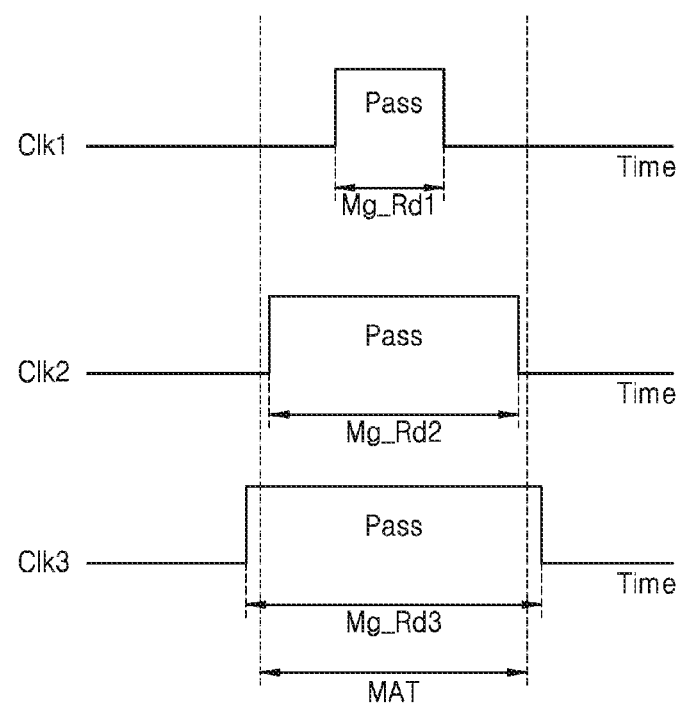

FIGS. 6A and 6B are diagrams illustrating a method of determining a component duty ratio through clock training of an SOC, according to an example embodiment.

Referring to FIGS. 3, 6A, and 6B, FIG. 6A illustrates a data valid window DW and a plurality of clocks, for example, first to third clocks Clk1, Clk2, and Clk3. Also, FIG. 6B illustrates a read margin (or a pass zone PASS) with respect to each of the plurality of clocks, for example, the first to third clocks Clk1, Clk2, and Clk3. The data valid window DW may be an area where valid data may be latched from data signals.

The SOC 10*a* may read the first data DATA1 stored in the component device 20*a* by using the first clock Clk1 having a first duty ratio. The SOC 10*a* may determine a first read margin Mg_Rd1 by using the read result Res_Rd, based on the first clock Clk1 and the first data DATA1. In an example, because a data transition time of the first clock Clk1 is relatively far from a center of the data valid window DW, the first read margin Mg_Rd1 corresponding to the first clock Clk1 may be small compared to a reference margin area MAT. Accordingly, the SOC 10*a* may generate the second clock Clk2 by changing the duty ratio to a second duty ratio. The second duty ratio may be received from an external device external to the SOC 10*a*.

The SOC 10*a* may read the first data DATA1 stored in the component device 20*a* by using the second clock Clk2 having the second duty ratio. The SOC 10*a* may determine a second read margin Mg_Rd2 by using the read result Res_Rd, based on the second clock Clk2 and the first data DATA1. In an example, because a data transition time of the second clock Clk2 is closer to the center of the data valid window DW compared to the first clock Clk1, the second read margin Mg_Rd2 may have a larger area than the first read margin Mg_Rd1 corresponding to the first clock Clk1 but may still have a smaller area than the reference margin area MAT. Accordingly, the SOC 10*a* may generate the third clock Clk3 by changing the duty ratio to a third duty ratio.

The SOC 10*a* may read the first data DATA1 stored in the component device 20*a* by using the third clock Clk3 having the third duty ratio. The SOC 10*a* may determine a third read margin Mg_Rd3 by using the read result Res_Rd, based on the third clock Clk3 and the first data DATA1. In an example, because a data transition time of the third clock Clk3 is closer to the center of the data valid window DW compared to the second clock Clk2, the third read margin Mg_Rd3 may have a larger area than the second read margin Mg_Rd2 corresponding to the second clock Clk2. Also, the third read margin Mg_Rd3 may have a larger area than the reference margin area MAT. Accordingly, the SOC 10*a* may determine the third duty ratio as the component duty ratio DR and may communicate with the component device 20*a* by using the third clock Clk3 having the third duty ratio.

Figure 7:
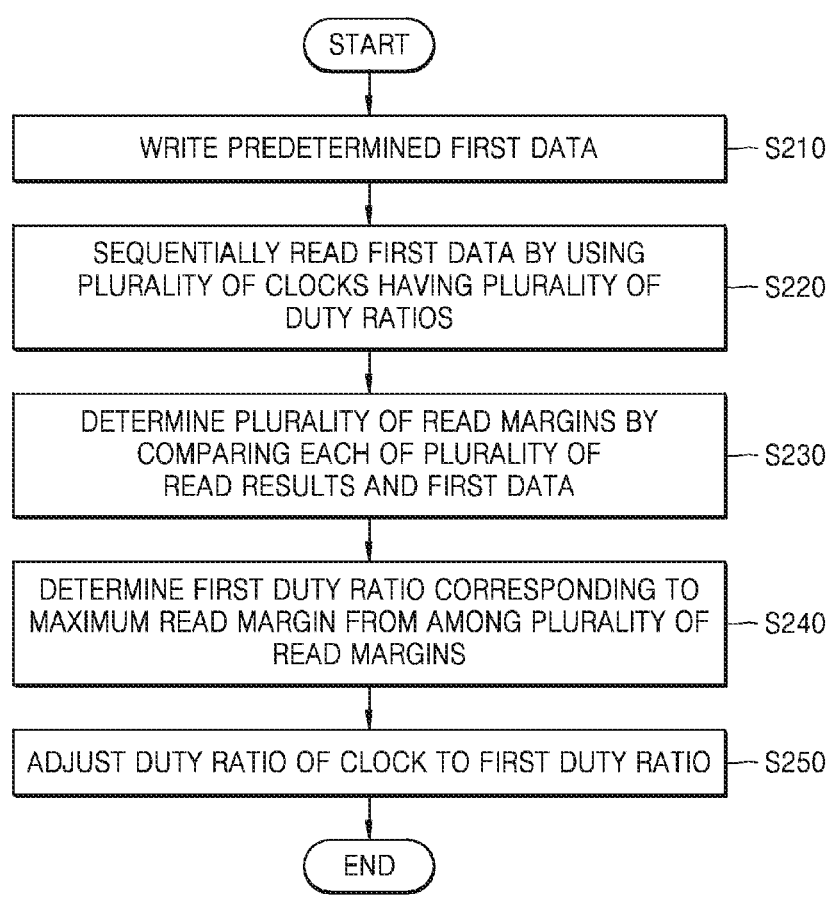
FIG. 7 is a flowchart illustrating a clock training operation method of a system on chip, according to an example embodiment.

FIG. 7 is a flowchart illustrating a clock training operation method of an SOC, according to an example embodiment. In more detail, FIG. 7 is a flowchart illustrating an operation of determining a clock having a maximum read margin from among a plurality of clocks having a plurality of duty ratios.

Referring to FIGS. 4 and 7, the SOC 10*a* may write the predetermined first data DATA1 to the component device 20*a* (operation S210). The SOC 10*a* may sequentially read the first data DATA1 by using a plurality of clocks Clk having a plurality of duty ratios (operation S220). The SOC 10*a* may determine a plurality of read margins Mg_Rd by comparing each of a plurality of read results Res_Rd to the first data DATA1 (operation S230).

The SOC 10*a* may determine a first duty ratio corresponding to a maximum read margin from among the plurality of read margins Mg_Rd (operation S240). The SOC 10*a* may determine the first duty ratio as a component duty ratio of the clock Clk and may adjust a duty ratio of the clock Clk to the first duty ratio (operation S250).

According to the inventive concept, as described above, smooth communication with the component device 20a may be performed by determining a duty ratio having a maximum read margin as the component duty ratio DR and setting the clock Clk to the component duty ratio DR.

Figures 8, 9:
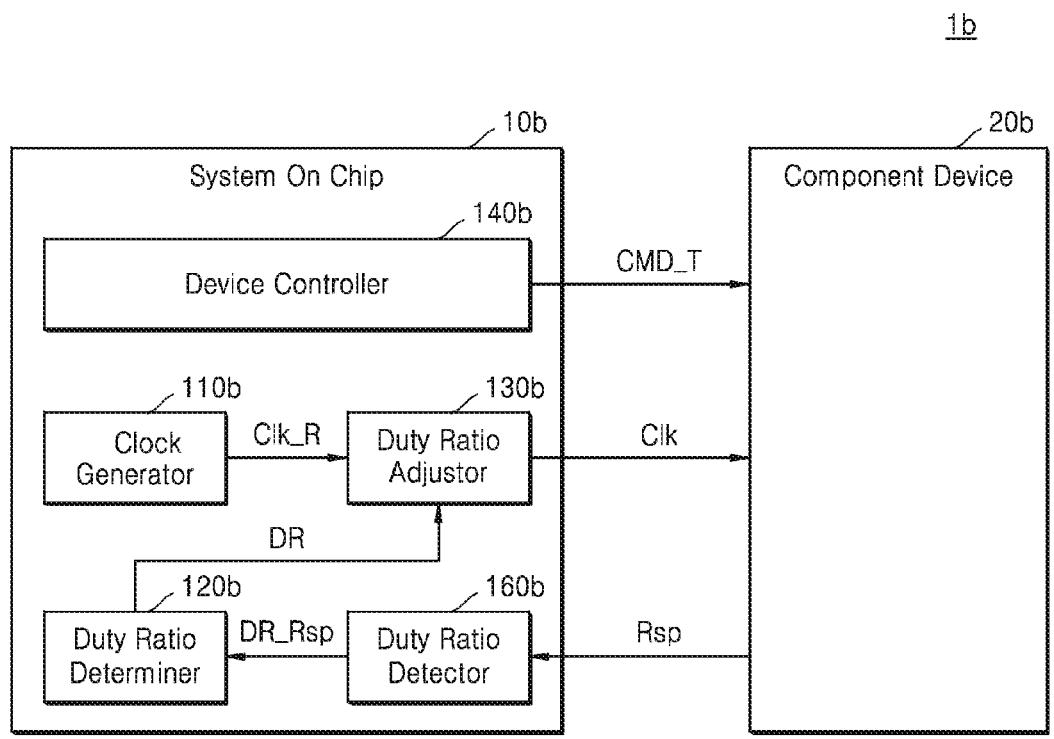
FIG. 8 is a table illustrating an operation method of a system on chip, according to an example embodiment.
FIG. 9 is a block diagram illustrating a computing system according to an example embodiment.

FIG. 8 is a table illustrating an operation method of an SOC, according to an example embodiment.

Referring to FIGS. 4 and 8, the SOC 10a may determine a plurality of read margins by using a plurality of clocks having a plurality of predetermined duty ratios. FIG. 8 illustrates an embodiment in which the plurality of duty ratios are 'four' of first to fourth duty ratios DR1 to DR4.

The SOC 10a may read the first data DATA1 by using the first clock Clk1 having the first duty ratio DR1 and may determine the first read margin Mg_Rd1 by comparing a corresponding read result to the first data DATA1. The SOC 10a may store the determined first read margin Mg_Rd1.

Next, the SOC 10a may read the first data DATA1 by using the second clock Clk2 having the second duty ratio DR2 and may determine the second read margin Mg_Rd2 by comparing a corresponding read result to the first data DATA1. The SOC 10a may store the determined second read margin Mg_Rd2.

Next, the SOC 10a may read the first data DATA1 by using the third clock Clk3 having the third duty ratio DR3 and may determine the third read margin Mg_Rd3 by comparing a corresponding read result to the first data DATA1. The SOC 10a may store the determined third read margin Mg_Rd3.

Also, the SOC 10a may read the first data DATA1 by using a fourth clock Clk4 having the fourth duty ratio DR4 and may determine a fourth read margin Mg_Rd4 by comparing a corresponding read result to the first data DATA1. The SOC 10a may store the determined fourth read margin Mg_Rd4.

The SOC 10a may determine which of the stored first to fourth read margins Mg_Rd1 to Mg_Rd4 is the largest. In an example in which the first read margin Mg_Rd1 is the largest among the first to fourth read margins Mg_Rd1 to Mg_Rd4, the SOC 10a may determine the first duty ratio DR1 as the component duty ratio DR and may smoothly communicate with the component device 20a by using the clock Clk having the first duty ratio DR1.

Although FIG. 8 illustrates an embodiment in which the plurality of predetermined duty ratios are four, this is an example, and the inventive concept may also be applied to a case in which the plurality of predetermined duty ratios are more or less than four.

FIG. 9 is a block diagram illustrating a computing system 1b according to an example embodiment. In more detail, FIG. 9 is a block diagram illustrating the computing system 1b determining the component duty ratio DR, based on the response Rsp of a component device 20b, according to a second embodiment. A repeated description of FIG. 2 will be omitted below.

Referring to FIG. 9, the computing system 1b may include an SOC 10b and the component device 20b, and the SOC 10b may include a clock generator 110b, a duty ratio determiner 120b, a duty ratio adjustor 130b, a device controller 140b, and a duty ratio detector 160b. The clock generator 110b, the duty ratio determiner 120b, the duty ratio adjustor 130b, and the device controller 140b may be substantially the same as or similar to the clock generator 110, the duty ratio determiner 120, and the duty ratio adjustor 130 described above with reference to FIG. 1, and the device controller 140a described above with reference to FIG. 4, and thus, a description thereof will be omitted.

The device controller 140b may output the training command CMD_T to the component device 20b in synchronization with the clock Clk. In an embodiment, the training command CMD_T may be a predetermined command for performing clock training. In an embodiment, the training command CMD_T may be a write command.

The component device 20b may output the response Rsp to the SOC 10b, based on the clock Clk, in response to the training command CMD_T. In an example, the component device 20b may be DRAM, and the response Rsp may be output via either one or both of DQ and DQS.

The duty ratio detector 160b may detect a response duty ratio DR_Rsp from the response Rsp. The response Rsp may have a different duty ratio from the clock Clk input by an environment (temperature, voltage, etc.) of the computing system 1b. Accordingly, the duty ratio detector 160b may generate the response duty ratio DR_Rsp by detecting a duty ratio of the response Rsp and may output the generated response duty ratio DR_Rsp to the duty ratio determiner 120b.

The duty ratio determiner 120b may determine whether or not the response duty ratio DR_Rsp is included in a reference duty ratio area, and based on the determination, may determine the component duty ratio DR. Also, the duty ratio determiner 120b may output the determined component duty ratio DR to the duty ratio adjustor 130.

The duty ratio adjustor 130 may generate the clock Clk by adjusting a duty ratio of the row clock Clk_R to the received component duty ratio DR, and the SOC 10b may communicate with the component device 20b by using the clock Clk having a duty ratio adjusted.

According to the inventive concept, an environment of the component device 20b may be considered by determining the component duty ratio DR of the clock Clk, based on a duty ratio of the response Rsp received from the component device 20b, and thus, communication between the SOC 10b and the component device 20b may be performed smoothly.

Figure 10:
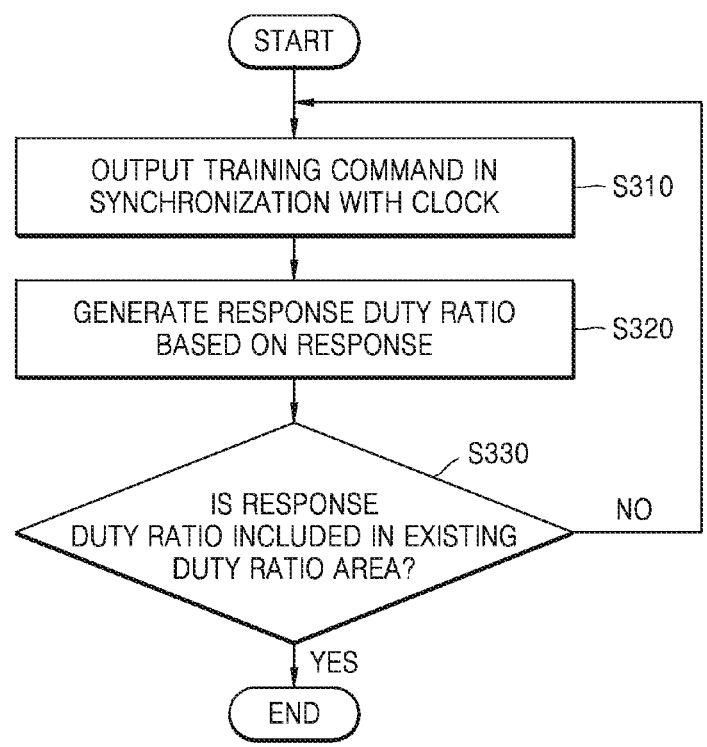
FIG. 10 is a flowchart illustrating a clock training operation method of a system on chip, according to an example embodiment.

FIG. 10 is a flowchart illustrating a clock training operation method of an SOC, according to an example embodiment.

Referring to FIGS. 9 and 10, the SOC 10b may output the training command CMD_T to the component device 20b in synchronization with the clock Clk (operation S310). The component device 20b may output the response Rsp to the SOC 10b in response to the training command CMD_T, and the SOC 10b may generate the response duty ratio DR_Rsp, based on the response Rsp (operation S320). In an embodiment, the SOC 10b may generate the response duty ratio DR_Rsp by detecting a duty ratio of the response Rsp.

The SOC 10b may determine whether or not the response duty ratio DR_Rsp is included in a reference duty ratio area (operation S330). When the response duty ratio DR_Rsp is included in the reference duty ratio area (operation S330, YES), the SOC 10b may determine a current duty ratio of the clock Clk as the component duty ratio DR. When the response duty ratio DR_Rsp is not included in the reference duty ratio area (operation S330, NO), the SOC 10b may adjust a duty ratio of the clock Clk to a duty ratio different from the current duty ratio (operation S340). In an embodiment, the SOC 10b may adjust a duty ratio of the clock Clk by raising or lowering the current duty ratio. The SOC 10b may repeat operations S310 to S330 by using the adjusted duty ratio.

According to the inventive concept, as described above, an optimum duty ratio whereby the response duty ratio DR_Rsp is included in a reference margin area may be determined by repeating operations S310 to S340, and the SOC 10b may smoothly communicate with the component device 20b by determining the determined duty ratio as the component duty ratio DR.

Figure 11A:
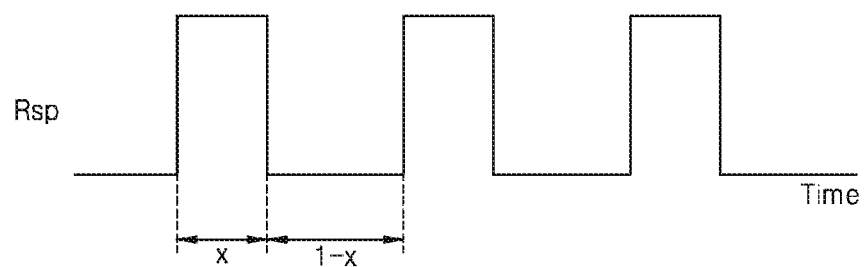
FIGS. 11A and 11B are diagrams illustrating a method of determining a component duty ratio through clock training of a system on chip, according to an example embodiment.
Figure 11B:
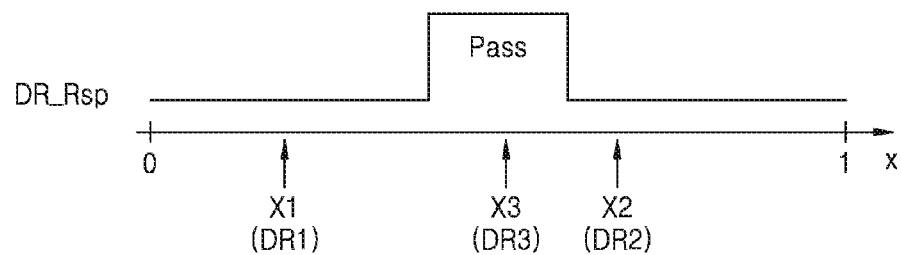

FIGS. 11A and 11B are diagrams illustrating a method of determining a component duty ratio through clock training of an SOC, according to an example embodiment.

Referring to FIGS. 9, 11A, and 11B, FIG. 11A may denote the response Rsp output by the component device 20b in response to the training command CMD_T and the clock Clk, and FIG. 11B may denote a predetermined reference duty ratio area Pass according to the response duty ratio DR_Rsp. In an example, the reference duty ratio area Pass may indicate an area including 'x=0.5'.

The SOC 10b may output the training command CMD_T to the component device 20b by using a first clock having the first duty ratio DR1, and in response to this, the component device 20b may output a first response having a first response duty ratio X1 to the SOC 10b. The SOC 10b may generate the first response duty ratio X1, based on the first response, and may determine whether or not the first response duty ratio X1 is included in the reference duty ratio area Pass. Because the first response duty ratio X1 is not included in the reference duty ratio area Pass, the SOC 10b may adjust a duty ratio of the clock Clk to the second duty ratio DR2. In an embodiment, because the first response duty ratio X1 is less than the reference duty ratio area Pass, the SOC 10b may adjust a duty ratio of the clock Clk to the second duty ratio DR2 that is greater than the first duty ratio DR1.

The SOC 10b may output the training command CMD_T to the component device 20b by using a second clock having the second duty ratio DR2, and in response to this, the component device 20b may output a second response having a second response duty ratio X2 to the SOC 10b. The SOC 10b may generate the second response duty ratio X2, based on the second response and may determine whether or not the second response duty ratio X2 is included in the reference duty ratio area Pass. Because the second response duty ratio X2 is not included in the reference duty ratio area Pass, the SOC 10b may adjust a duty ratio of the clock Clk to the third duty ratio DR3. In an embodiment, because the second response duty ratio X2 is greater than the reference duty ratio area Pass, the SOC 10b may adjust a duty ratio of the clock Clk to the third duty ratio DR3 that is less than the second duty ratio DR2.

The SOC 10b may output the training command CMD_T to the component device 20b by using a third clock having the third duty ratio DR3, and in response to this, the component device 20b may output a third response having a third response duty ratio X3 to the SOC 10b. The SOC 10b may generate the third response duty ratio X3, based on the third response and may determine whether or not the third response duty ratio X3 is included in the reference duty ratio area Pass. Because the third response duty ratio X3 is included in the reference duty ratio area Pass, the SOC 10b may determine the third duty ratio DR3 as the component duty ratio DR. Accordingly, the SOC 10b may find the optimum component duty ratio DR and may smoothly communicate with the component device 20b by using the third clock having the third duty ratio DR3.

Figure 12:
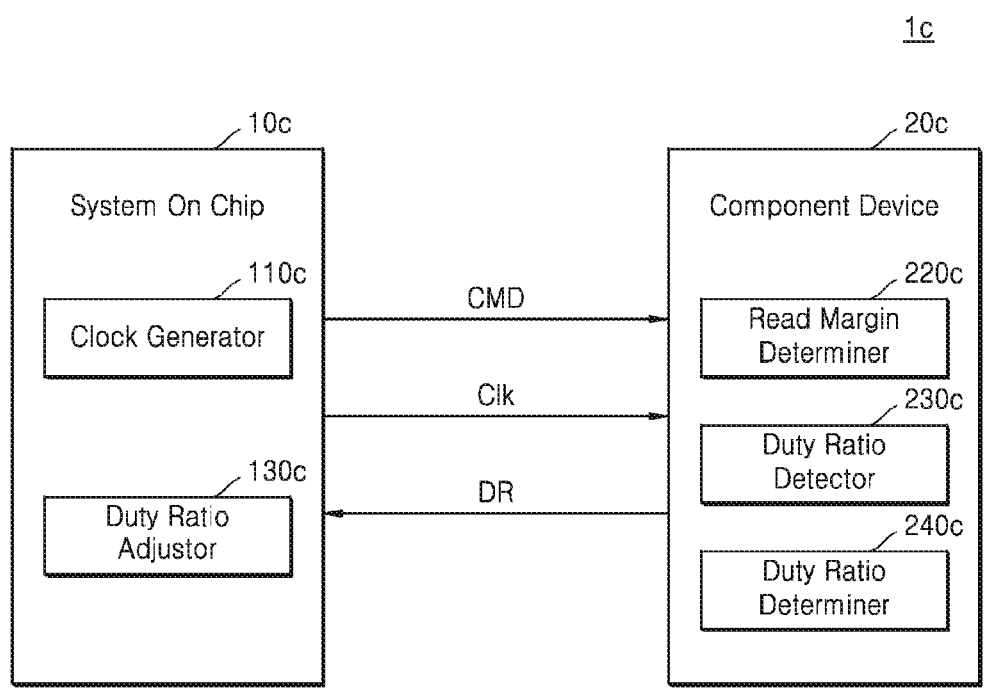
FIG. 12 is a block diagram illustrating a computing system according to an example embodiment.

FIG. 12 is a block diagram illustrating a computing system 1c according to an example embodiment. A repeated description of FIG. 2 will be omitted below.

Referring to FIG. 12, the computing system 1c may include an SOC 10c and a component device 20c, the SOC 10c may include a clock generator 110c and a duty ratio adjustor 130c, and the component device 20c may include a read margin determiner 220c, a duty ratio detector 230c, and a duty ratio determiner 240c. The clock generator 110c and the duty ratio adjustor 130c may be substantially the same as or similar to the clock generator 110 and the duty ratio adjustor 130 of FIG. 2, and the read margin determiner 220c, the duty ratio detector 230c, and the duty ratio determiner 240c may be substantially the same as or similar to the read margin determiner 150a of FIG. 4 and the duty ratio detector 160b and the duty ratio determiner 120b of FIG. 9, except that the read margin determiner 220c, the duty ratio detector 230c, and the duty ratio determiner 240c are included in the component device 20c instead of the SOC 10c. Accordingly, differences caused by the read margin determiner 220c, the duty ratio detector 230c, and the duty ratio determiner 240c included in the component device 20c instead of the SOC 10c will be mainly explained.

The SOC 10c may output the command CMD to the component device 20c in synchronization with the clock Clk during an initialization process. In an embodiment, the command CMD may include the training command CMD_T.

In an embodiment, in response to the command CMD, the read margin determiner 220c may determine a read margin, based on a data pattern of predetermined first data and a read result. In an embodiment, the read margin determiner 220c may find a pass zone by comparing a data pattern of first data to a read result, and based on an area of the pass zone, may determine a read margin. The duty ratio determiner 240c may determine the component duty ratio DR based on the read margin received from the read margin determiner 220c. The duty ratio determiner 240c may output the determined component duty ratio DR to the duty ratio adjustor 130c of the SOC 10c, and the duty ratio adjustor 130c may adjust a row clock to the clock Clk having the component duty ratio DR.

In an embodiment, in response to the command CMD, the component device 20c may generate a response, and the duty ratio detector 230c may detect a response duty ratio, based on the response. The duty ratio detector 230c may output the response duty ratio to the duty ratio determiner 240c. The duty ratio determiner 240c may determine whether or not the response duty ratio is included in a reference duty ratio area, and based on the determination, may determine the component duty ratio DR. Also, the duty ratio determiner 240c may output the determined component duty ratio DR to the duty ratio adjustor 130c of the SOC 10c, the duty ratio adjustor 130c may adjust a row clock to the clock Clk having the component duty ratio DR, and the SOC 10c may communicate with the component device 20c by using the clock Clk having a duty ratio adjusted.

According to an embodiment, the component duty ratio DR may be efficiently determined by determining the component duty ratio DR at the inside of the component device 20c instead of the SOC 10c.

FIG. 13 is a block diagram illustrating an interface for use in a computing system, according to an example embodiment.

Referring to FIG. 13, a computing system 160 may be implemented as a data processor capable of using or supporting Mobile Industry Processor Interface (MIPI), and may include an AP 1600, an image sensor 1620, and a display 1630. A Camera Serial Interface (CSI) host 1602 of the AP 1600 may perform serial communication with a CSI device 1621 of the image sensor 1620 via CSI. In an embodiment, the CSI host 1602 may include a DESerializer (DES), and the CSI device 1621 may include a SERializer (SER). The AP 1600 may be implemented as an SOC described above with reference to FIGS. 1 to 12.

A Display Serial Interface (DSI) host 1601 of the AP 1600 may perform serial communication with a DSI device 1631 of the display 1630 via DSI. In an embodiment, the DSI host 1601 may include an SER, and the DSI device 1631 may include a DES. The computing system 160 may further include a radio frequency (RF) chip 1640 capable of communicating with the AP 1600. A Physical Layer (PHY) 1603 of the AP 1600 and a PHY 1641 of the RF chip 1640 may perform data transmission and reception according to MIPI DigRF. Also, the AP 1600 may further include a DigRF MASTER 1604 for controlling data transmission and reception according to MIPI DigRF of the PHY 1603.

The computing system 160 may include a global positioning system (GPS) 1610, a storage 1650, a microphone 1660, DRAM 1670, and a speaker 1680. Also, the computing system 160 may perform communication by using Ultra WideBand (UWB) 1693, Wireless Local Area Network (WLAN) 1692, Worldwide Interoperability for Microwave Access (WIMAX) 1691, etc. However, the structure and interface of the computing system 160 is an example, and the example embodiments are not limited thereto.

The GPS 1610, the image sensor 1620, the display 1630, the RF chip 1640, the storage 1650, the microphone 1660, the DRAM 1670, the speaker 1680, the UWB 1693, the WLAN 1692, and the WIMAX 1691 (hereinafter referred to as a component device) may be implemented as a component device described above with reference to FIGS. 1 to 12. That is, the AP 1600 may determine an optimum component clock through clock training during an initialization process with the component devices 1610, 1620, 1630, 1640, 1650, 1660, 1670, 1680, 1693, 1692, and 1691 and thus communicate with the component devices 1610, 1620, 1630, 1640, 1650, 1660, 1670, 1680, 1693, 1692, and 1691, and accordingly, the AP 1600 and the component devices 1610, 1620, 1630, 1640, 1650, 1660, 1670, 1680, 1693, 1692, and 1691 may efficiently communicate with each other.

As is traditional in the field of the inventive concepts, the example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

While the inventive concept has been shown and described with reference to embodiments thereof, it will be understood that various changes in form and details may be made therein without departing from the spirit and scope of the following claims.

What is claimed is:

1. A system on chip comprising:
a clock generator configured to:
generate a clock signal; and
output the clock signal to a component device external to the system on chip;
a duty ratio determiner configured to determine a component duty ratio;
a duty ratio adjustor configured to:
adjust a current duty ratio of the clock signal to the component duty ratio; and
output the clock signal of which the current duty ratio is adjusted, to the component device;
a device controller configured to output, to the component device, a read command for reading data in synchronization with the clock signal having a first duty ratio; and
a read margin determiner configured to receive a read result from the component device, and determine a read margin, based on the read result,
wherein the duty ratio determiner determines the component duty ratio based on the read result of reading the data and based on the read margin.

2. The system on chip of claim 1, wherein the duty ratio determiner is further configured to:
determine whether the read margin is comprised in a reference margin area; and
determine the component duty ratio, based on whether the read margin is comprised in the reference margin area.

3. The system on chip of claim 2, wherein the duty ratio determiner is further configured to:
determine, as the component duty ratio, a second duty ratio different from the first duty ratio, in response to the read margin being determined to not be comprised in the reference margin area; and
determine the first duty ratio as the component duty ratio, in response to the read margin being determined to be comprised in the reference margin area.

4. The system on chip of claim 1, wherein the duty ratio adjustor is further configured to sequentially output a plurality of clock signals respectively having a plurality of duty ratios, to the component device, and
the read margin determiner is further configured to:
receive a plurality of read results corresponding to the plurality of duty ratios; and
based on the plurality of read results, determine a plurality of read margins corresponding to the plurality of duty ratios.

5. The system on chip of claim 4, wherein the duty ratio determiner is further configured to determine, among the plurality of duty ratios, a third duty ratio corresponding to a maximum read margin among the plurality of read margins, as the component duty ratio.

6. The system on chip of claim 1, further comprising:
a duty ratio detector configured to:
receive a response corresponding to the first duty ratio, from the component device; and
detect a response duty ratio, from the response.

7. The system on chip of claim 6, wherein the duty ratio determiner is further configured to determine whether the response duty ratio is comprised in a reference duty ratio area.

8. The system on chip of claim 7, wherein the duty ratio determiner is further configured to:
   determine, as the component duty ratio, a second duty ratio different from the first duty ratio, in response to the response duty ratio being determined to not be comprised in the reference duty ratio area; and
   determine the first duty ratio, as the component duty ratio, in response to the response duty ratio being determined to be comprised in the reference duty ratio area.

9. A computing system comprising:
   a system on chip configured to:
      generate a clock signal; and
      transmit the clock signal and a read command for reading data in synchronization with the clock signal having a first duty cycle; and
   a component device configured to process the read command that is received from the system on chip, based on the clock signal that is received from the system on chip,
   wherein the system on chip comprises:
      a clock generator configured to generate the clock signal;
      a duty ratio determiner configured to determine a component duty ratio; and
      a duty ratio adjustor configured to adjust a current duty ratio of the clock signal, to the component duty ratio, and output the clock signal of which the current duty ratio is adjusted, to the component device; and
      a read margin determiner configured to receive a read result of reading the data from the component device, and determine a read margin, based on the read result,
   wherein the duty ratio determiner is configured to determine the component duty ratio based on the read result of reading the data and based on the read margin.

10. The computing system of claim 9, wherein the component device comprises a memory, and the system on chip is further configured to output, to the component device, a write command for writing the data to the memory.

11. A clock training method of a system on chip for transmitting and receiving a plurality of signals to and from a component device, the clock training method comprising:
   generating a clock signal of a first duty ratio;
   outputting a read command for reading data to the component device, in synchronization with the clock signal having the first duty ratio;
   receiving a read result of reading the data from the component device;
   determining a read margin, based on the read result;
   determining a second duty ratio based on the read margin; and
   adjusting the first duty ratio of the clock signal to the second duty ratio different from the first duty ratio.

12. The clock training method of claim 11, further comprising:
   outputting, to the component device, a write command for writing data.

13. The clock training method of claim 11, further comprising:
   detecting a response duty ratio, from the read result; and
   determining whether the response duty ratio is comprised in a reference duty ratio area.

14. The clock training method of claim 13, wherein the adjusting the first duty ratio to the second duty ratio comprises adjusting the first duty ratio to the second duty ratio, in response to the response duty ratio being determined to not be comprised in the reference duty ratio area.

15. The clock training method of claim 11, wherein the clock training method is performed during an initialization process of the system on chip.

* * * * *